(12) United States Patent
Nah et al.

(10) Patent No.: US 10,644,051 B2
(45) Date of Patent: May 5, 2020

(54) IMAGE SENSOR

(71) Applicant: Samsung Electronics Co., Ltd., Suwon-si, Gyeonggi-do (KR)

(72) Inventors: Seung Joo Nah, Gwangju (KR); Dong Min Han, Daegu (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/933,514

(22) Filed: Mar. 23, 2018

(65) Prior Publication Data

US 2019/0115375 A1 Apr. 18, 2019

(30) Foreign Application Priority Data

Oct. 13, 2017 (KR) ........................ 10-2017-0133550

(51) Int. Cl.
*H01L 27/146* (2006.01)

(52) U.S. Cl.
CPC ...... *H01L 27/1463* (2013.01); *H01L 27/1464* (2013.01); *H01L 27/14689* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 7,518,172 B2 | 4/2009 | Moon et al. | |
| 8,378,399 B2 | 2/2013 | Maeda | |
| 8,685,818 B2 | 4/2014 | Shang et al. | |
| 9,054,007 B2 | 6/2015 | Hu et al. | |
| 9,287,309 B2 | 3/2016 | Choi et al. | |
| 9,466,629 B2 | 10/2016 | Yoon et al. | |
| 9,496,304 B2 | 11/2016 | Hu et al. | |
| 9,553,119 B2 | 1/2017 | Choi et al. | |
| 2015/0372031 A1* | 12/2015 | Yoon | H01L 27/14603 257/446 |
| 2016/0079288 A1* | 3/2016 | Choi | H01L 27/1463 438/70 |
| 2016/0204144 A1 | 7/2016 | Lee | |

FOREIGN PATENT DOCUMENTS

| | | |
|---|---|---|
| KR | 10-2001-0038607 A | 5/2001 |
| KR | 10-2010-0138087 A | 12/2010 |

* cited by examiner

*Primary Examiner* — Walter H Swanson
*Assistant Examiner* — Kien C Ly
(74) *Attorney, Agent, or Firm* — Muir Patent Law, PLLC

(57) ABSTRACT

An image sensor includes a substrate including opposite first and second surfaces, first and second gates, on the first surface of the substrate, which each extend in a first direction, a first isolation layer in the substrate between the first and second gates and having a first width in a second direction crossing the first direction, a second isolation layer on the first isolation layer, in the substrate, and having a second width smaller than the first width in the second direction. The second isolation layer is closer to the second surface of the substrate than the first isolation layer. A vertical distance between the first isolation layer and the second isolation layer is ⅓ or less of a height of the first isolation layer.

20 Claims, 23 Drawing Sheets

FIG. 7
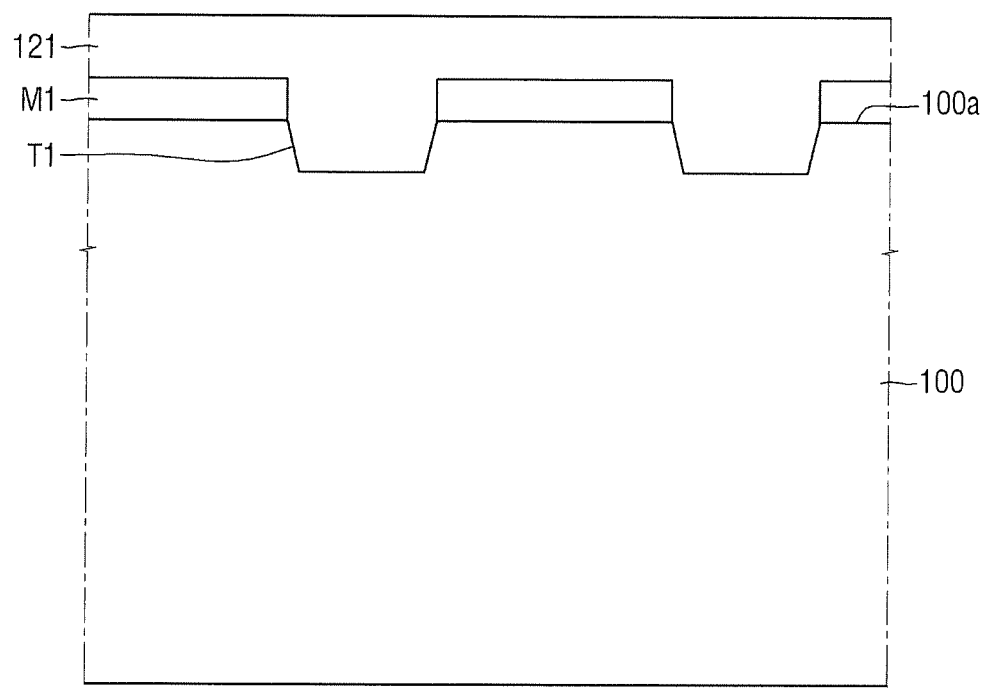
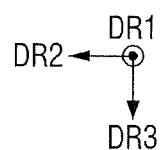

FIG. 8
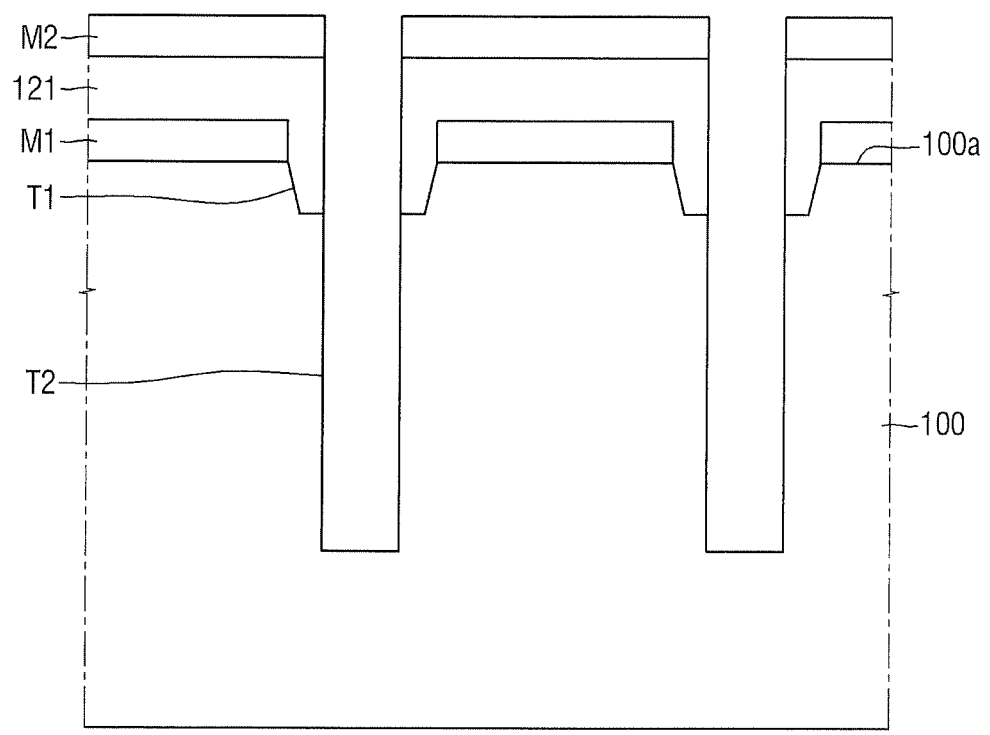
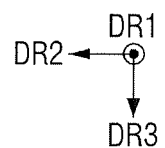

FIG. 10
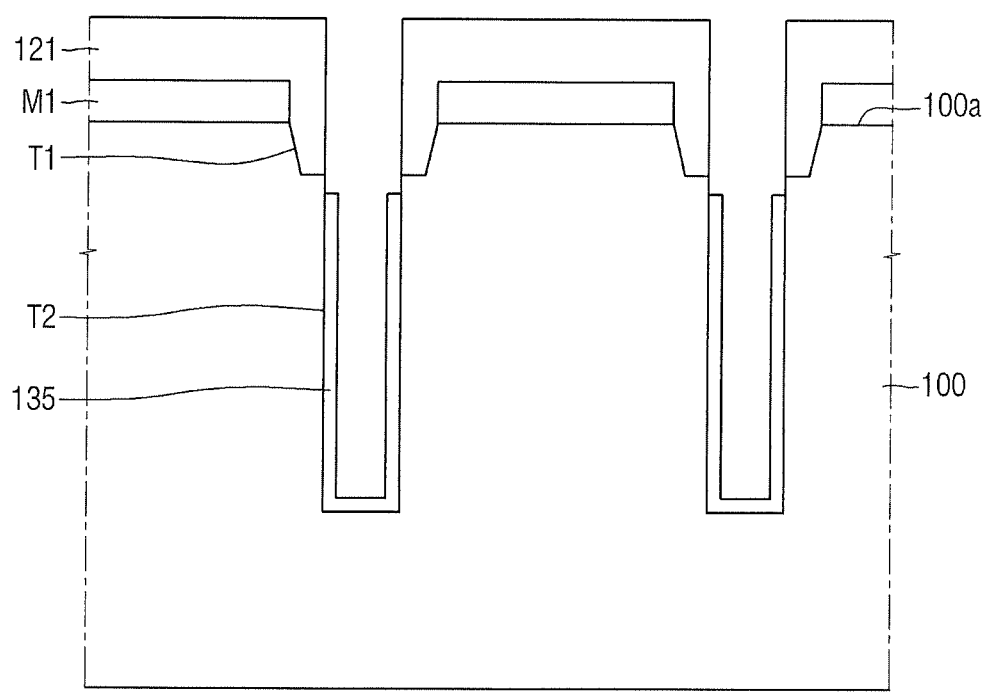
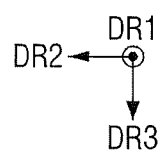

IMAGE SENSOR

CROSS-REFERENCE TO RELATED APPLICATION

This application claims priority under 35 U.S.C. § 119 to Korean Patent Application No. 10-2017-0133550, filed on Oct. 13, 2017, in the Korean Intellectual Property Office, the disclosure of which is hereby incorporated by reference in its entirety.

TECHNICAL FIELD

Example embodiments of the present disclosure relate to an image sensor

DISCUSSION OF RELATED ART

An image sensor is an image device for converting an optical image into an electrical signal. An image sensor is classified into a charge coupled device (CCD) and a complementary metal oxide semiconductor (CMOS) image sensor (CIS). The CIS includes a plurality of pixels arranged in two-dimensions. Each of pixels includes a photodiode (PD). The photodiode is configured to convert incident light into an electrical signal.

With development of computer and communication industries, there are strong demands for high performance image sensors in various devices, for example, a digital camera, a camcorder, a personal communication system (PCS), a game device, a security camera, a medical micro camera, or a robot. Such image sensors are also highly integrated.

SUMMARY

According to example embodiments of the inventive concepts, an image sensor may include a substrate including a first surface and a second surface, first and second gates on the first surface of the substrate, wherein the first and second gates each extend in a first direction, a first isolation layer in the substrate between the first and second gates, wherein the first isolation layer has a first width in a second direction that crosses the first direction, and a second isolation layer on the first isolation layer, in the substrate, wherein the second isolation layer has a second width that is smaller than the first width in the second direction, wherein the second isolation layer is closer to the second surface of the substrate than the first isolation layer, and wherein a vertical distance between the first isolation layer and the second isolation layer is ⅓ or less of a height of the first isolation layer.

According to example embodiments of the inventive concepts, an image sensor may include a substrate including a first surface and a second surface disposed opposite to each other, first and second gates on the first surface of the substrate, wherein the first and second gates each extend in a first direction, a first trench in the substrate between the first and second gates, wherein the first trench has a first width in a second direction that crosses the first direction and has a first depth in a third direction perpendicular to the first and second directions, a second trench in the substrate, wherein the second trench has a second width smaller than the first width in the second direction, and wherein the second trench vertically overlaps the first trench, a first isolation layer in the first trench, and a second isolation layer in the second trench wherein the second isolation layer includes a different material from that of the first isolation layer, and wherein a vertical distance between the first isolation layer and the second isolation layer is ⅓ or less of the first depth of the first trench.

According to example embodiments of the inventive concepts, an image sensor may include a substrate including a first surface and a second surface disposed opposite to one another, a photoelectric conversion element in the substrate, first and second gates spaced apart from one another on the first surface of the substrate, a first isolation layer in the substrate between the first and second gates, a second isolation layer in the substrate, wherein the second isolation layer includes polysilicon, and wherein the second isolation layer vertically overlaps the first isolation layer and is closer to the second surface of the substrate than the first isolation layer, and a micro lens on the second surface of the substrate, wherein a vertical distance between the first isolation layer and the second isolation layer ⅓ or less of a height of the first isolation layer.

BRIEF DESCRIPTION OF THE DRAWINGS

FIGS. 5 to 17 illustrate a method of manufacturing an image sensor according to example embodiments.

DETAILED DESCRIPTION

Figure 1:
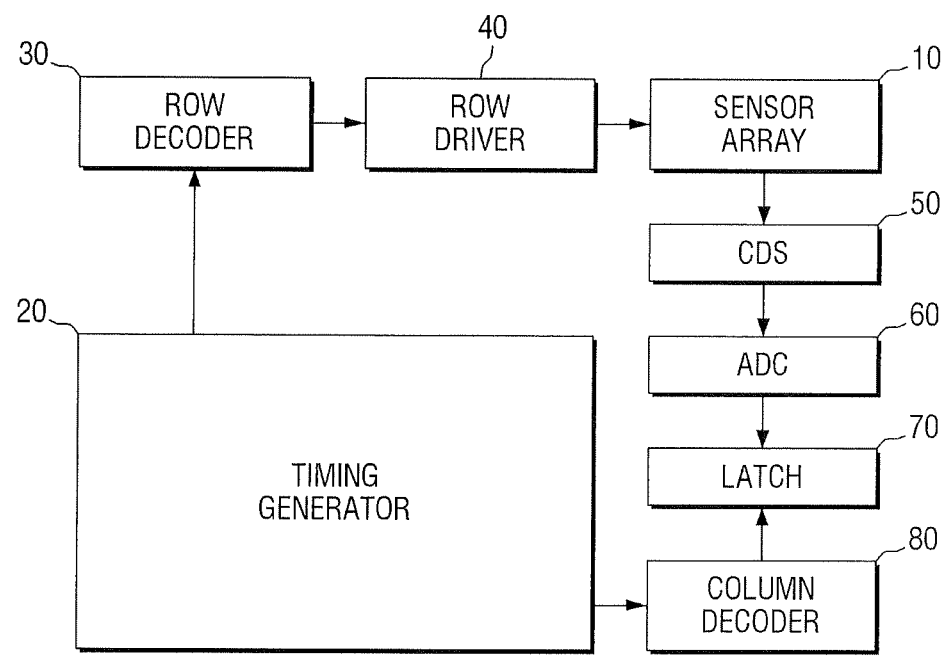
FIG. 1 illustrates a block diagram of an image sensor according to example embodiments.

Various example embodiments will now be described more fully hereinafter with reference to the accompanying drawings. Like reference numerals may refer to like elements throughout this application.

FIG. 1 illustrates a block diagram of an image sensor according to example embodiments.

Referring to FIG. 1, an image sensor according to example embodiments of the inventive concepts includes an active pixel sensor array 10, a timing generator 20, a row decoder 30, a row driver 40, a correlated double sampler (CDS) 50, an analog-to-digital converter (ADC) 60, a latch unit 70, a column decoder 80.

The active pixel sensor array 10 may include a plurality of unit pixels arranged two-dimensionally. The unit pixels may include a photo-electric conversion elements. The unit pixels may be configured to convert optical images into electrical output signals.

The active pixel sensor array 10 may be operated by receiving a plurality of drive signals, for example, a row selection signal provided from the row driver 40, a reset signal, and/or a carrier transfer signal. The converted electric output signal may be transferred to the correlated double sampler 50 through a vertical signal line.

The timing generator 20 may provide a timing signal and a control signal to the row decoder 30 and the column decoder 80.

The row driver 40 may provide a plurality of drive signals to drive the unit pixels to the active pixel sensor array 10 depending on the results decoded by the row decoder 30. When the unit pixels are arranged in rows and columns, the drive signals may be provided to the unit pixels in each row or each column.

The correlated double sampler 50 may hold and sample by receiving the output signals from the active pixel sensor array 10 through the vertical signal line. For example, a certain noise level and a signal level by the output signals may be double-sampled in the correlated double sampler 50 to output a difference level corresponding to difference between the noise level and the signal level.

The analog-to-digital convertor 60 may convert an analog signal corresponding to the difference level into a digital signal and output the digital signal.

The latch unit 70 may latch the digital signal and sequentially output the latched signal to an image signal processing unit in accordance with the results decoded by the column decoder 80.

Figure 2:
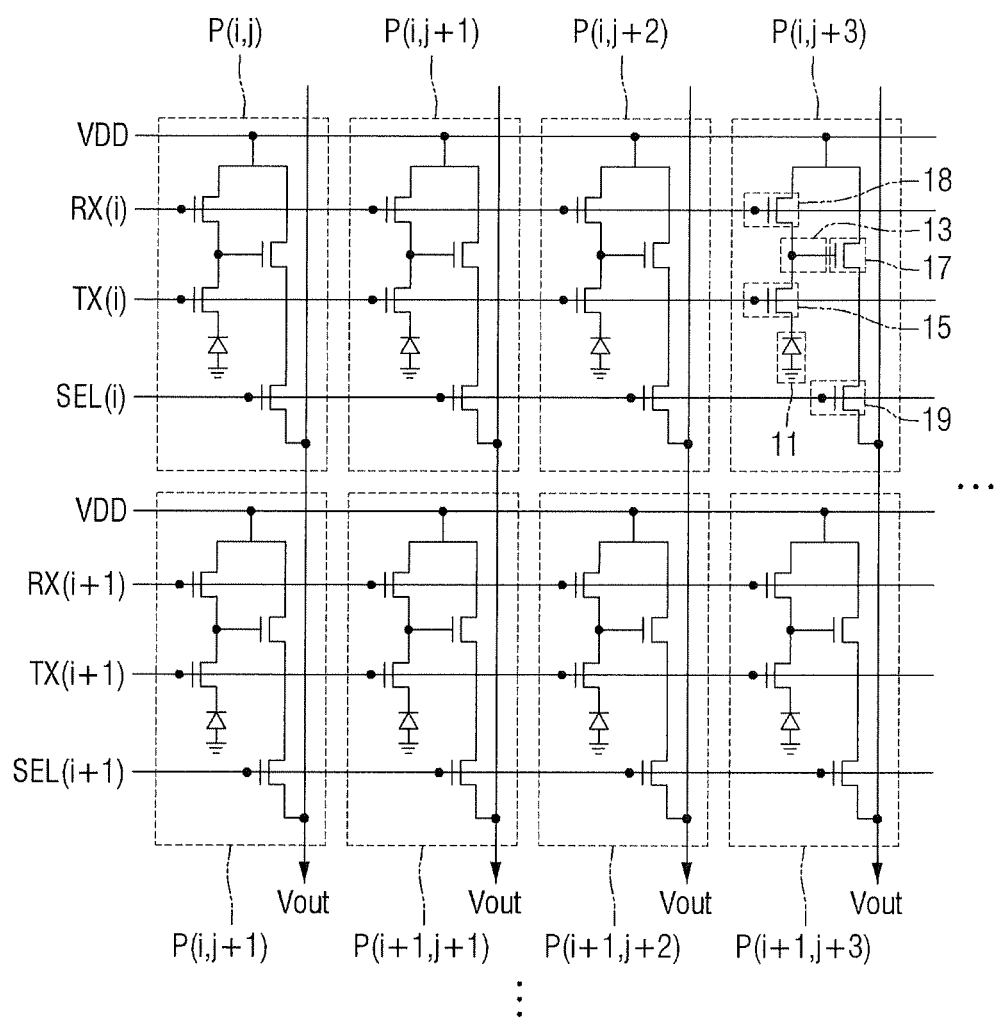
FIG. 2 is an equivalent circuit diagram of a sensor array of FIG. 1.

FIG. 2 is an equivalent circuit diagram of a sensor array of FIG. 1.

Referring to FIG. 2, the active pixel sensor array 10 is constituted by pixels P arranged in rows and columns. Each pixel P includes a photoelectric conversion element 11, a floating diffusion region 13, a charge transfer element 15, a drive element 17, a reset element 18, and a selection element 19. The functions thereof will be described using pixels P(i, j), P(i, j+1), P(i, j+2), P(i, j+3), . . . in an i-th row as an example.

The photoelectric conversion element 11 may accumulates charges corresponding to an amount of light by receiving incident light. The photoelectric conversion element may include a photodiode, a phototransistor, a photogate, a pinned photodiode, or a combination thereof. The photodiode is illustrated as an example in FIG. 2.

The photoelectric conversion element 11 may be coupled to the electric transfer element 15 for transferring the accumulated charges to the floating diffusion region 13.

Since the floating diffusion region 13, which converts the charges into a voltage, has a parasitic capacitance, the charges may be cumulatively stored therein The drive element 17, illustrated as a source follower amplifier, may amplify variation in an electrical potential of the floating diffusion region 13 receiving the accumulated charges from the photoelectric conversion element 11 and output the amplified variation to an output line Vout.

The reset element 18 may periodically reset the floating diffusion region 13. The reset element 18 may be formed of one metal oxide semiconductor (MOS) transistor driven by a bias provided by a reset line RX(i) which applies a predetermined bias (e.g., a reset signal). When the reset element 18 is turned on by the bias provided by the reset line RX(i), a predetermined electrical potential, e.g., a source voltage (VDD), provided to a drain of the reset element 18 may be transferred to the floating diffusion region 13.

The selection element 19 may be configured to select the pixels P to be read on a row-by-row basis. The selection element 19 may be formed of one MOS transistor driven by a bias (e.g., a row selection signal) provided by a row selection line SEL(i). When the selection element 19 is turned on by the bias provided by the row selection line SEL(i), the predetermined electrical potential, e.g., the source voltage VDD, provided to a drain of the selection element 19 may be transferred to a drain of the drive element 17.

A transfer line TX(i) applying a bias to the charge transfer element 15, the reset line RX(i) applying the bias to the reset element 18, and the row selection line SEL(i) applying the bias to the selection element 19 may arranged to extend substantially parallel to a row direction.

Figure 3:
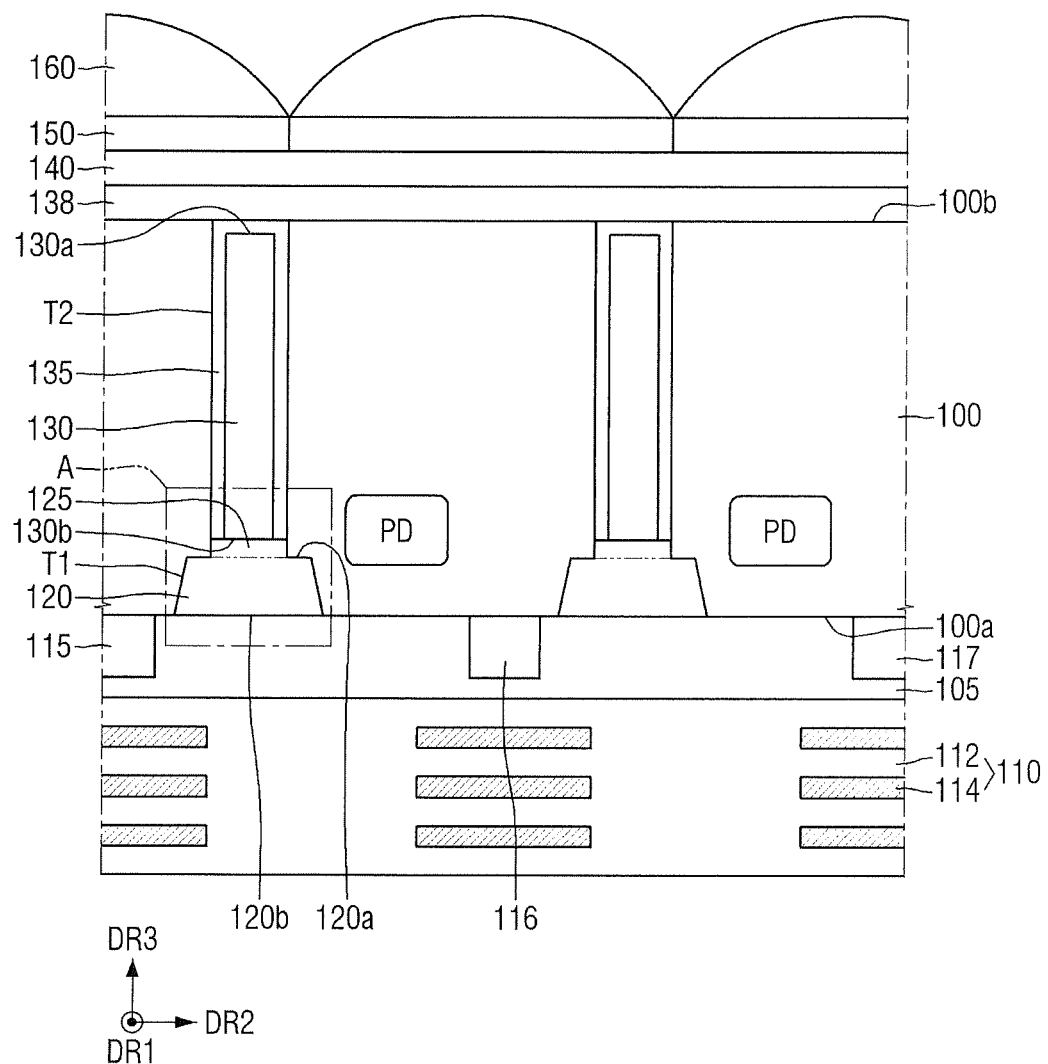
FIG. 3 illustrates an image sensor according to example embodiments.
Figure 4:
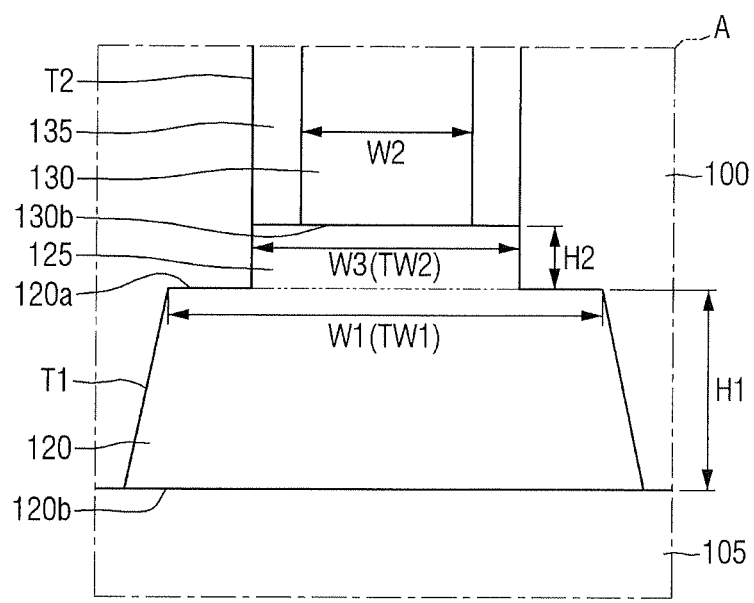
FIG. 4 is an enlarged view of portion A of FIG. 3.

FIG. 3 illustrates an image sensor according to example embodiments. FIG. 4 is an enlarged view of portion A of FIG. 3.

Referring to FIGS. 3 and 4, the image sensor according to example embodiments of the inventive concepts includes a substrate 100, a photoelectric conversion element (PD), an insulating layer 105, an insulating structure 110, a first gate 115, a second gate 116, a third gate 117, a first isolation layer 120, a second isolation layer 130, a third isolation layer 125, a first trench passivation layer 135, a passivation layer 138, a planarization layer 140, a color filter 150, and a micro lens 160.

The substrate 100 may include a first surface 100a and a second surface 100b that are opposite to each other. The first surface 100a of the substrate 100 may be a front side. The second surface 100b of the substrate 100 may be a back side.

The substrate 100 may be a P- or N-type bulk substrate, a substrate including a P- or N-type epitaxial layer on a P-type bulk substrate, or a substrate including a P- or N-type epitaxial layer on an N-type bulk substrate. In some embodiments, the substrate 100 may be an organic plastics substrate.

The photoelectric conversion element PD, e.g., a photodiode, may be disposed in the substrate 100. The photoelectric conversion element PD may be disposed adjacent to the first surface 100a of the substrate 100, but the inventive concepts are not limited thereto.

The first gate 115, the second gate 116, and the third gate 117 may be disposed spaced apart from one another on the first surface 100a of the substrate 100. Each of the first to third gates 115, 116, and 117 may extend in a first direction DR1 parallel to the first surface 100a of the substrate 100. Each of the first to third gates 115, 116, and 117 may be, e.g., one of a gate of the charge transfer element 15, a gate of the reset element 18, and a gate of the drive element 17 shown in FIG. 2.

Although three gates are disposed on the first surface 100a of the substrate 100 as shown in FIG. 3, the inventive concepts are not limited thereto.

Although the first to third gates 115, 116, and 117 are disposed on the first surface 100a of the substrate 100 as shown in FIG. 3, the inventive concepts are not limited thereto. In some embodiments, each of the first to third gates 115, 116, and 117 may be disposed or buried in the substrate 100.

The insulating structure 110 may be disposed on the first surface 100a, i.e., the front side of the substrate 100. The insulating structure 110 may include a metal line 114 and an insulating interlayer 112 covering the metal line 114.

The insulating interlayer 112 may include, e.g., silicon oxide, silicon nitride, silicon oxynitride, a low-k dielectric material, or a combination thereof.

The metal line 114 may include, e.g., aluminum (Al), copper (Cu), tungsten (W), cobalt (Co), and/or ruthenium (Ru), but the inventive concepts are not limited thereto.

The metal line 114 may include a plurality of stacked metal lines. Although the metal line 114 includes three metal lines which are sequentially stacked on the substrate 100 as shown in FIG. 3, the inventive concepts are not limited thereto.

The insulating layer 105 may be disposed between the first surface 100a of the substrate 100 and the insulating structure 110. The insulating layer 105 may be disposed on the first surface 100a of the substrate 100 to cover the first to third gates 115, 116, and 117. The insulating layer 105 may include, e.g., silicon oxide, silicon nitride, silicon oxynitride, a lower-k dielectric material, or a combination thereof.

The passivation layer 138 may be disposed on the second surface 100b, i.e., the back side, of the substrate 100. The passivation layer 138 may extend along the second surface 100b of the substrate 100. For example, the passivation layer 138 may contact the substrate 100, i.e., the second surface 100b of the substrate 100. The passivation layer 138 may include, e.g., a high-k dielectric material. The passivation layer 138 may include a material of an amorphous crystal structure. For example, at least a portion of the high-k dielectric material included in the passivation layer 138 may have an amorphous crystal structure. However, the inventive concepts are not limited thereto.

The color filter 150 may be disposed on the passivation layer 138. The color filter 150 may be disposed on the second surface 100b of the substrate 100 and between the passivation layer 138 and the micro lens 160. The color filter 150 may include a red color filter, a green color filter, and a blue color filter.

The micro lens 160 may be disposed on the passivation layer 138. The micro lens 160 may be disposed on the passivation layer 138 and the color filter 150 that are sequentially stacked on the second surface 100b of the substrate 100. The micro lens 160 may include an organic material, e.g., photosensitive resin, or an inorganic material.

The planarization layer 140 may be disposed between the passivation layer 138 and the color filter 150. The planarization layer 140 may include, e.g., silicon oxide, silicon nitride, resin, or a combination thereof. Although the planarization layer 140 is formed of a single layer as shown in FIG. 3, the inventive concepts are not limited thereto.

The first isolation layer 120 may be in the substrate 100 between the first gate 115 and the second gate 116. Further, the first isolation layer 120 may be in the substrate 100 between the second gate 116 and the third gate 117. The first isolation layer 120 may be disposed in a first trench T1 in the first surface 100a of the substrate 100. A lower surface 120b of the first isolation layer 120 may contact the insulating layer 105.

Although the first isolation layer 120 completely fills the first trench as shown in FIGS. 3 and 4, the inventive concepts are not limited thereto. Further, although a first width W1 of an upper surface 120a and a width of the lower surface 120b of the first isolation layer 120 are different as shown in FIGS. 3 and 4, the inventive concepts are not limited thereto. The lower surface 120b of the first isolation layer 120 may be proximate to the first surface 100a of the substrate 100. The upper surface 120a of the first isolation layer 120 may be spaced apart from the first and second surfaces 100a and 100b of the substrate 100.

The first isolation layer 120 may include, e.g., silicon oxide, silicon nitride, silicon carbide, silicon oxycarbide, silicon oxynitride, and/or silicon oxycarbonitride.

The second isolation layer 130 may be disposed in the substrate 100 between the first gate 115 and the second gate 116 and between the second gate 116 and the third gate 117. The second isolation layer 130 may be disposed on the first isolation layer 120. The second isolation layer 130 may vertically overlap the first isolation layer 120. The second isolation layer 130 may extend in a third direction DR3 perpendicular to the first surface 100a of the substrate 100. The third direction DR3 may be perpendicular to both the first direction DR1 and a second direction DR2 crossing the first direction DR1. The second isolation layer 130 may be disposed in a second trench T2 on the first trench T1. A sidewall of the second trench T2 may extend from the first trench T1 to the second surface 100b of the substrate 100. In some embodiments, the second trench T2 may be spaced apart from the second surface 100b of the substrate 100.

A sidewall of the second isolation layer 130 may extend to the second surface 100b of the substrate 100 along the sidewall of the second trench T2. The second isolation layer 130 may have an upper surface 130a proximate to the second surface 100b of the substrate 100 and a lower surface 130b spaced apart from the second surface 100b of the substrate 100. In some embodiments, the upper surface 130a of the second isolation layer 130 may be spaced apart from the first and second surfaces 100a and 100b of the substrate 100.

The second isolation layer 130 may include a different material from that of the first isolation layer 120. The second isolation layer 130 may include a material having improved gap-fil properties, e.g., polysilicon. However, the inventive concepts are not limited thereto.

The lower surface 130b of the second isolation layer 130 may be closer to the second surface 100b of the substrate 100 than the upper surface 120a of the first isolation layer 120. Therefore, electrical coupling between the second isolation layer 130 including polysilicon and each of the first to third gates 115, 116, and 117 may be reduced.

The first trench passivation layer 135 may be disposed in the second trench T2. The first trench passivation layer 135 may be disposed between the sidewall of the second isolation layer 130 and the sidewall of the second trench T2 (or between the second isolation layer 130 and the substrate 100) and between the second isolation layer 130 and the passivation layer 138. The first trench passivation layer 135 may cover the sidewall and an upper surface 130a of the second isolation layer 130.

Although the first trench passivation layer 135 conformally extends along an inner surface of the second trench T2 as shown in FIGS. 3 and 4, the inventive concepts are not limited thereto.

The first trench passivation layer 135 may include the same material as the passivation layer 138, for example, a high-k dielectric material. In some embodiments, the first trench passivation layer 135 may include a different material from that of the passivation layer 138.

The third isolation layer 125 may be disposed in the second trench T2 between the first isolation layer 120 and the second isolation layer 130. The third isolation layer 125 may be disposed in the second trench T2, between the upper surface 120a of the first isolation layer 120 and the lower surface 130b of the second isolation layer 130 and between the upper surface 120a of the first isolation layer 120 and a lower surface of the first trench passivation layer 135.

Although the lower surface 130b of the second isolation layer 130 and the lower surface of the first trench passivation layer 135 are coplanar as shown in FIGS. 3 and 4, the inventive concepts are not limited thereto.

The third isolation layer 125 may include the same material as that of the first isolation layer 120, for example, silicon oxide, silicon nitride, silicon carbide, silicon oxycarbide, silicon oxynitride, and/or silicon oxycarbonitride.

A second width W2 of a lower surface 130b of the second isolation layer 130 in the second direction DR2 may be smaller than the first width W1 of the upper surface 120a of the first isolation layer 120 in the second direction DR2.

A third width W3 of the third isolation layer 125 in the second direction DR2 may be smaller than the first width W1 of the first isolation layer 120 and be greater than the second width W2 of the second isolation layer 130.

A second width TW2 of the second trench T2 in the second direction DR2 may be smaller than a first width TW1 of a surface of the first trench T1 in the second direction DR2 (that is farthest away from the first surface 100a of the substrate 100).

A first depth (or height) H1 of the first trench T1 in the third direction DR3 may be more than three times a second depth (or height) of the third isolation layer 125 in the third direction DR3. For example, the first isolation layer 120 in the first trench T1 may have the first depth (or height) H1 that is more than three times a distance (i.e., the second height H2) between the upper surface 120a of the first isolation layer 120 and the lower surface 130b of the second isolation layer 130.

As used herein, the expression "the first depth H1 is more than three times the second height H2" means that the distance (depth or height difference) H2 between the upper surface 120a of the first isolation layer 120 and the lower surface 130b of the second isolation layer 130 is from zero to ⅓ of the first depth H1 of the first isolation layer 120.

In some embodiments, the first depth H1 may be three times the second depth H2. In some embodiments, the second depth H2 may be zero.

As the second height H2 is ⅓ or less of the first height H1, the gap-fill margin in the second trench T2 may be improved.

Although it is described above that the first isolation layer 120 and the second isolation layer 130 are disposed in the substrate 100 of the image sensor, the inventive concepts are not limited thereto. In some embodiments, the isolation layers according to the inventive concepts may be disposed in a semiconductor substrate including fin-type patterns.

In the image sensor according to example embodiments of the inventive concepts, the lower surface 130b of the second isolation layer 130 may be disposed higher than the upper surface 120a of the first isolation layer 120 with respect to the first to third gates 115, 116, and 117 (or spaced farther than the upper surface 120a of the first isolation layer 120 from the first to third gates 115. 116, and 117), such that the electrical coupling between the second isolation layer 130 and each of the first to third gates 115, 116, and 117 may be reduced.

FIGS. 5 to 17 illustrate a method of manufacturing an image sensor according to example embodiments.

Figure 5:
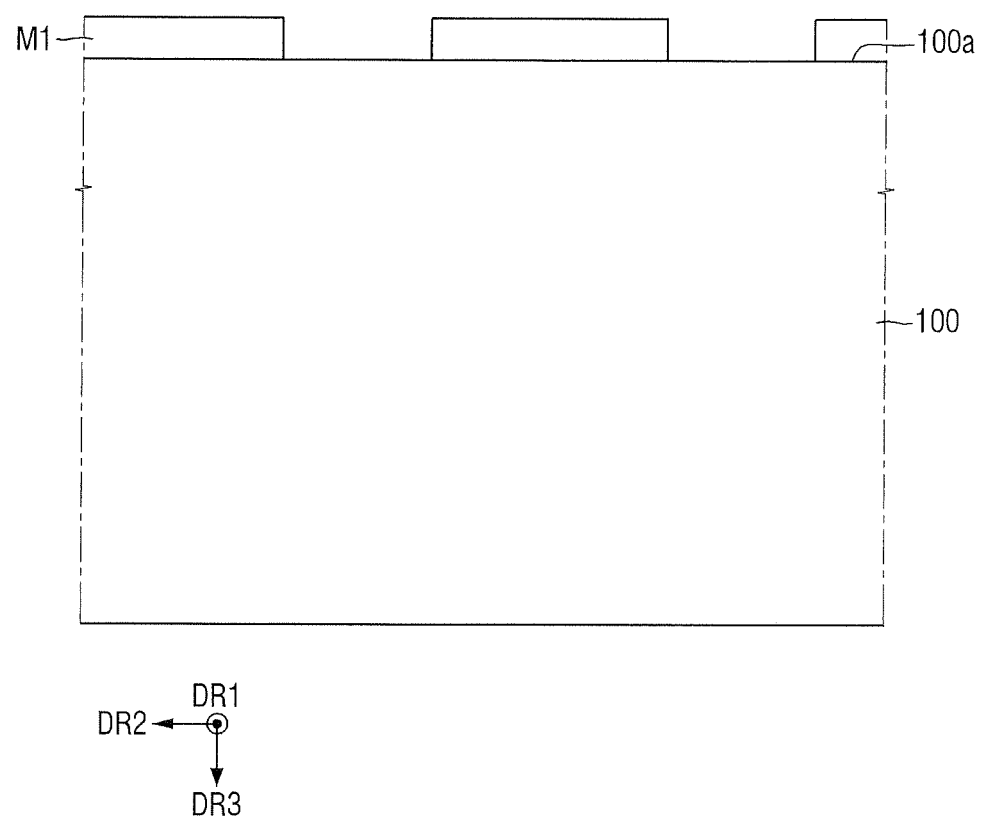

Referring to FIG. 5, a mask pattern M1 is formed on the first surface 100a of the substrate 100.

Figure 6:
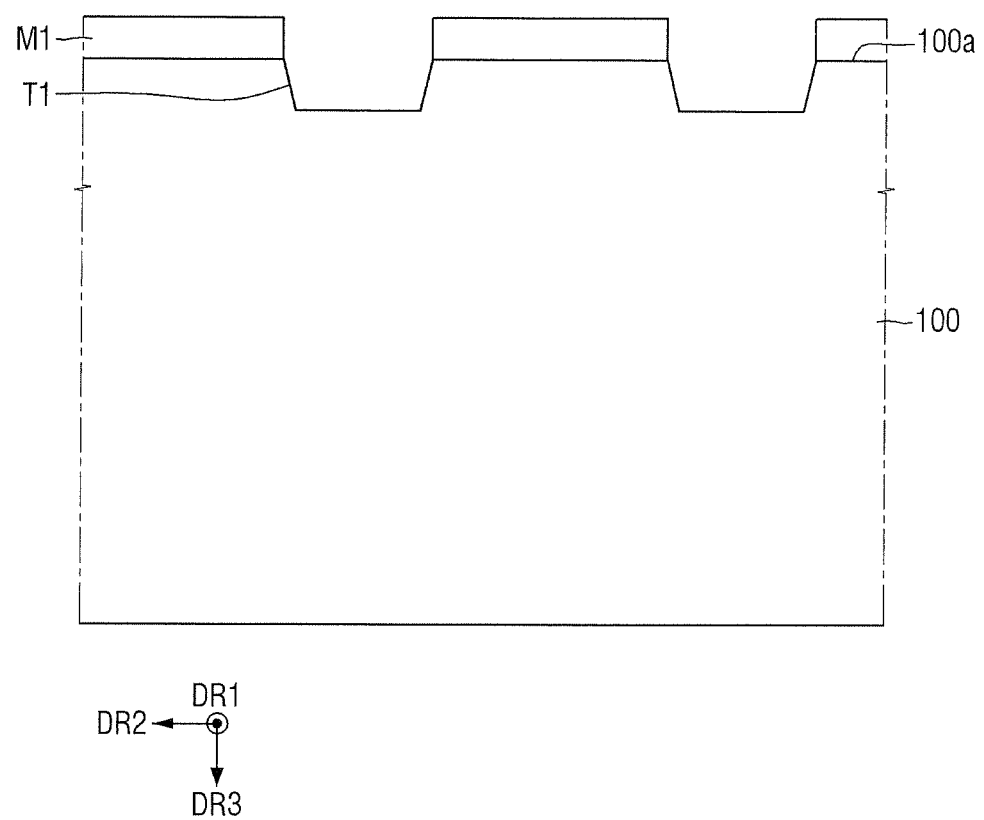

Referring to FIG. 6, the first surface 100a of the substrate 100 is etched using the first mask pattern M1 as an etch mask to form the first trench T1 in the substrate 100. Although a sidewall of the first trench T1 has a sloped profile as shown in FIG. 6, the inventive concepts are not limited thereto.

Referring to FIG. 7, a first filling layer 121 is formed on the first mask pattern M1 and in the first trench T1

The first filling layer 121 may include, e.g., silicon oxide, silicon nitride, silicon carbide, silicon oxycarbide, silicon oxynitride, and/or silicon oxycarbonitride.

Referring to FIG. 8, a second mask pattern M2 is formed on the first filling layer 121. The first filling layer 121 and the substrate 100 are etched using the second mask M2 as an etch mask to form the second trench T2 in the substrate 100.

The second trench T2 may pass through the first filling layer 121 in the first trench T2 and extend into the substrate 100 below the first trench T2. The second trench T2 may be formed to have the second width (see, e.g., TW2 of FIG. 4) smaller than the first width (see, e.g., TW1 of FIG. 4) of the first trench T1

Figure 9:
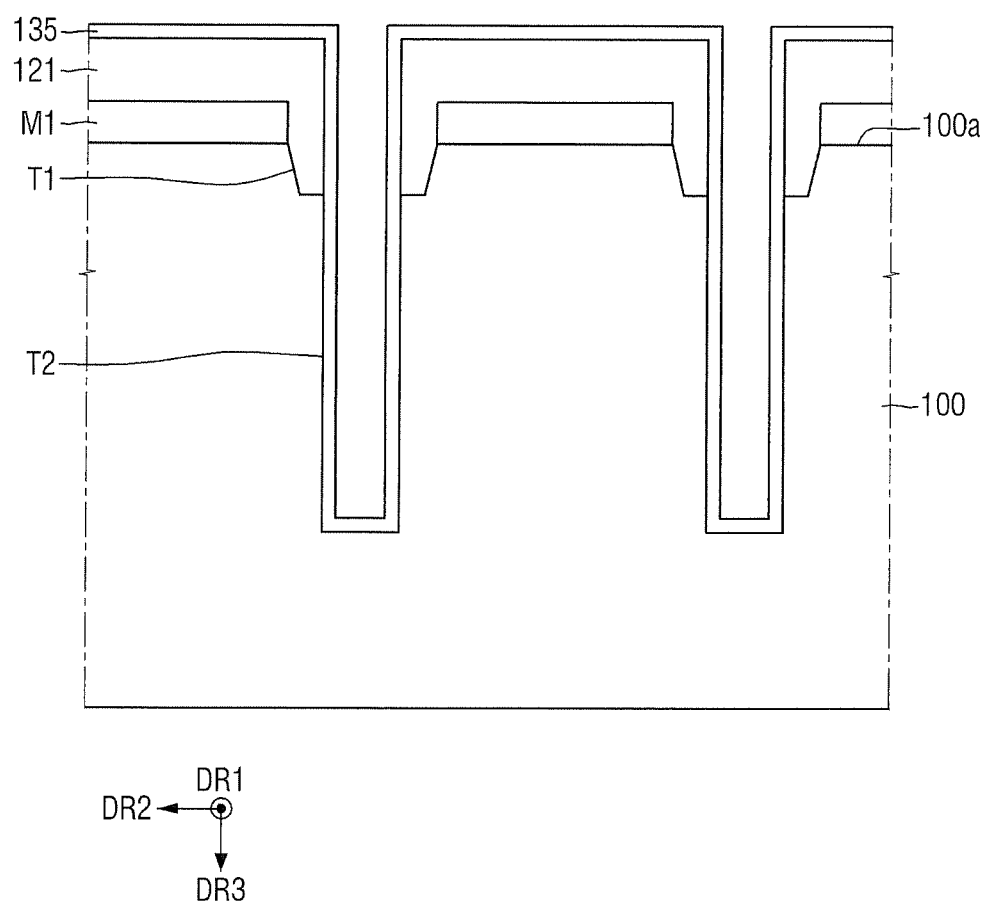

Referring to FIG. 9, after removing the second mask pattern M2, the first trench passivation layer 135 is formed on an inner surface of the second trench T2 and on the first filling layer 121. The first trench passivation layer 135 may include a high-k dielectric material. Although the first trench passivation layer 135 is conformally formed on the inner surface of the trench T2 and on the first filling layer 121 as shown in FIG. 9, the inventive concepts are not limited thereto.

Referring to FIG. 10, the first trench passivation layer 135 is etched to remove a portion of the first trench passivation layer 135 on the first filling layer 121. At this time, another portion of the first trench passivation layer 135 on the sidewall of the second trench T2 may be etched, such that a portion of a sidewall of the second trench T2 (or a portion of the substrate 100) below the first trench T1 may be exposed together with another portion of the sidewall of the second trench T2 in the first trench T1.

Figure 11:
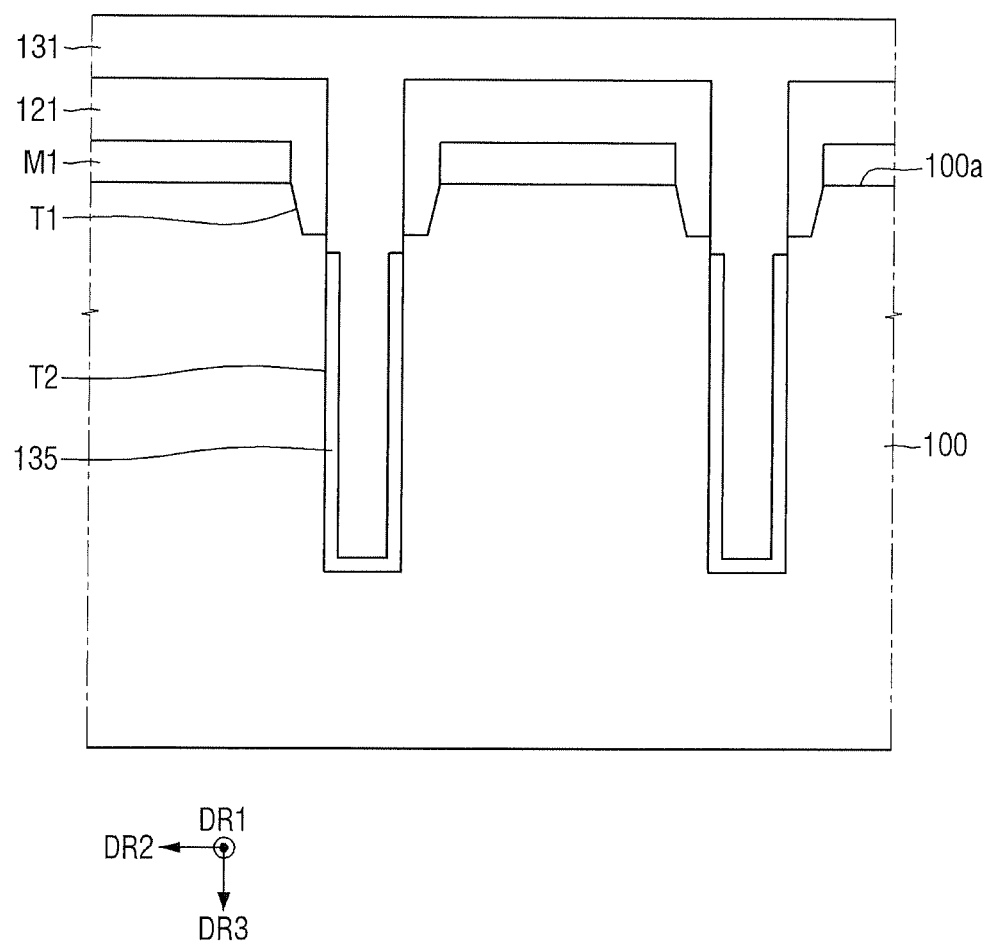

Referring to FIG. 11, a second filling layer 131 is formed on the exposed sidewall of the second trench T2, the first filling layer 121, and the first trench passivation layer 135. The second filling layer 131 may include polysilicon. The second filling layer 131 may completely fill the second trench T2 having the first trench passivation layer 135.

Figure 12:
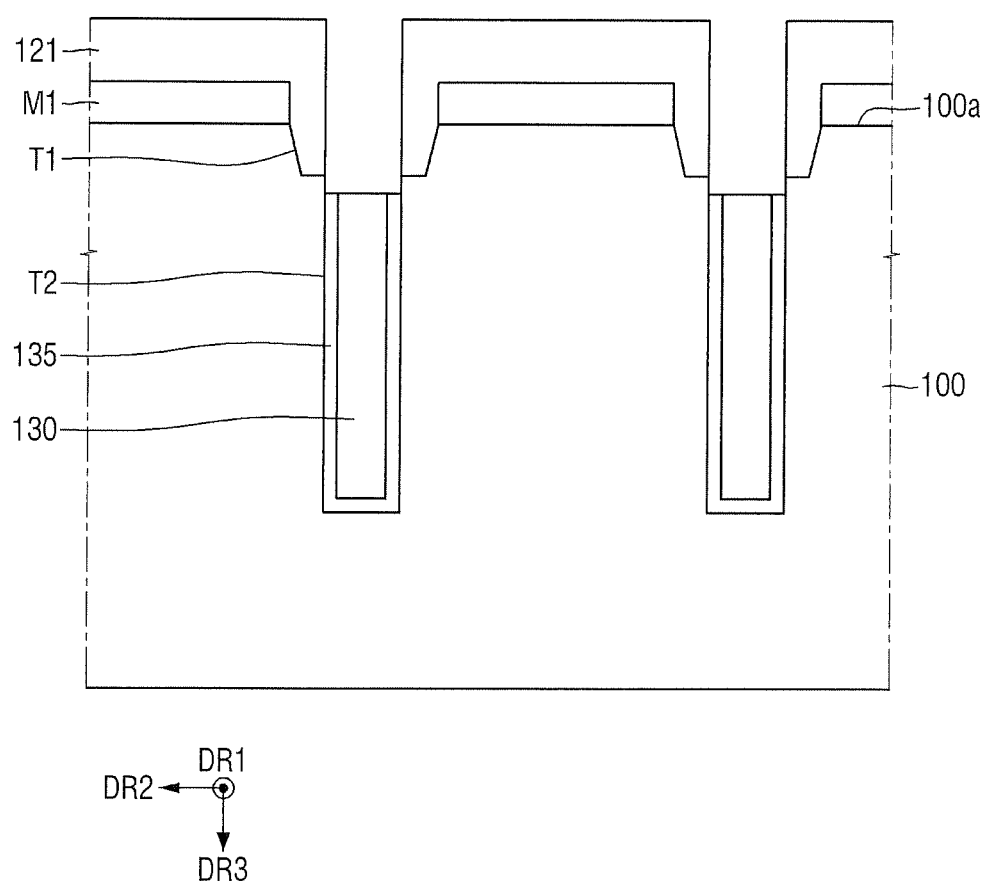

Referring to FIG. 12, the second filling layer 131 is etched-back to remove a portion of the second filling layer 131 that are formed on the first filling layer 121 and on the exposed sidewall of the second trench T2, thus forming the second isolation layer 130 on the first trench passivation layer 135 in the second trench T2. By the above etch-back process, an upper surface of the second isolation layer 130 may be positioned at a lower level than a lower surface of the first trench T1, thus exposing a portion of the sidewall of the second trench T2. Although an upper surface of the first trench passivation layer 135 and an upper surface of the second isolation layer 130 are coplanar as shown in FIG. 12, the inventive concepts are not limited thereto.

Figure 13:
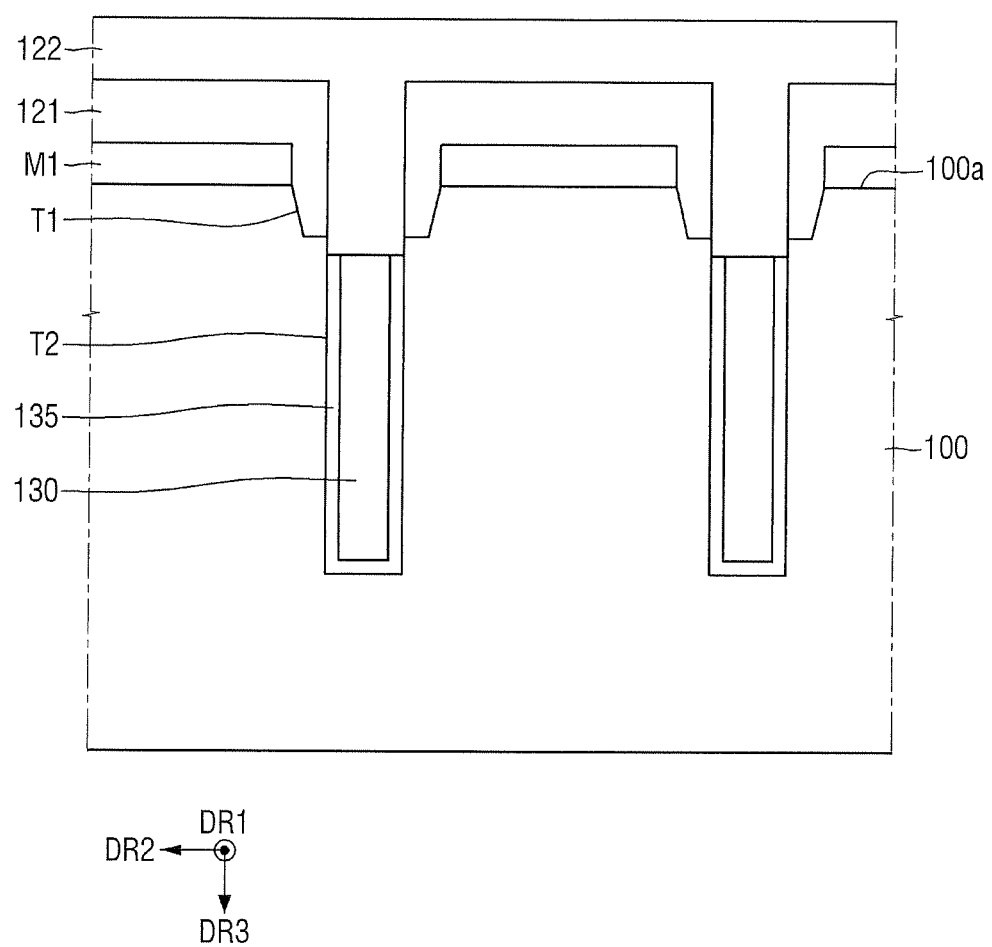

Referring to FIG. 13, a third filling layer 122 is formed on the exposed sidewall of the second trench T2, the first filling layer 121, the first trench passivation layer 135, and the second isolation layer 130.

The third filling layer 122 may include the same material as that of the first filling layer 121, for example, silicon oxide, silicon nitride, silicon carbide, silicon oxycarbide, silicon oxynitride, and/or silicon oxycarbonitride.

Figure 14:
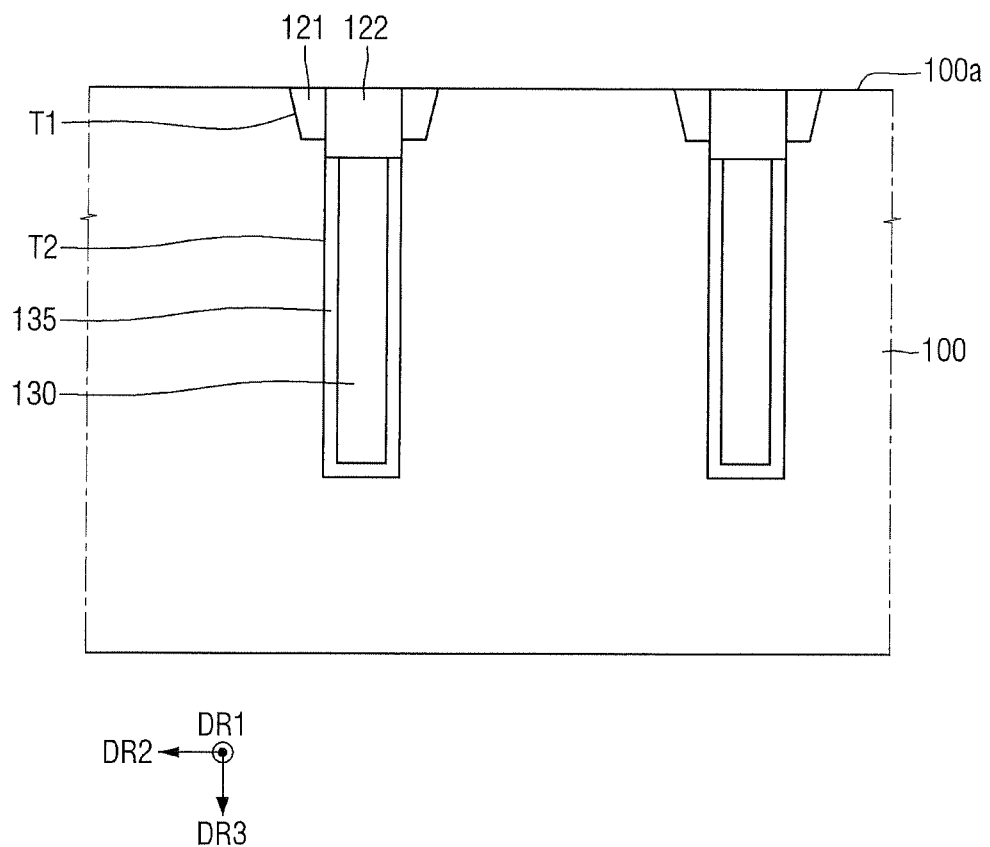

Referring to FIG. 14, a planarization process (e.g., a chemical mechanical polishing process) is performed to remove a portion of the first filling layer 121, a portion of the third filling layer 122, and the first mask pattern M1. Thus, the first surface 100a of the substrate 100 may be exposed.

Figure 15:
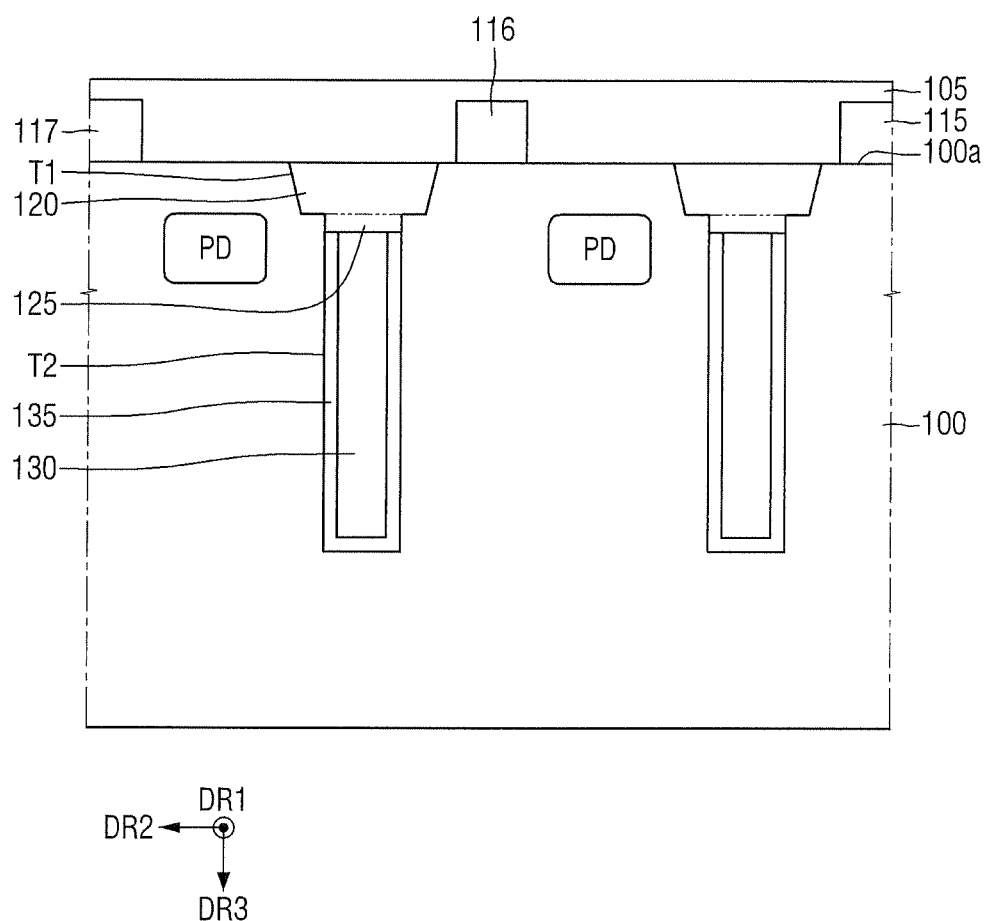

Referring to FIG. 15, the first filling layer 121 and a portion of the third filling layer 122 that are in the first trench T1 is defined as the first isolation layer 120, and the other portion of the third filling layer 122 in the second trench T2 is defined as the third isolation layer 125. The first isolation layer 120 and the third isolation layer 125 may include a same material.

The photoelectric conversion element PD is formed in the substrate 100. The photoelectric conversion element PD may be formed by an ion implantation process, but the inventive concepts are not limited thereto. Although the photoelectric conversion element PD is formed proximate to the first surface 100a of the substrate 100 as shown in FIG. 15, the inventive concepts are not limited thereto.

The first gate 115, the second gate 116, and the third gate 117 are formed on the first surface 100a of the substrate 100. Each of the first to third gates 115, 116, and 117 may be formed not to overlap the first isolation layer 120. The first isolation layer 120 may be disposed between the first gate 115 and the second gate 116 and between the second gate 116 and the third gate 117.

The insulating layer 105 is formed to cover the first surface 100a of the substrate 100, the first to third gates 115, 116, and 117, and the first isolation layer 120. The insulating layer 105 may include, e.g., silicon oxide, silicon nitride, silicon oxynitride, a low-k dielectric material, or a combination thereof.

Figure 16:
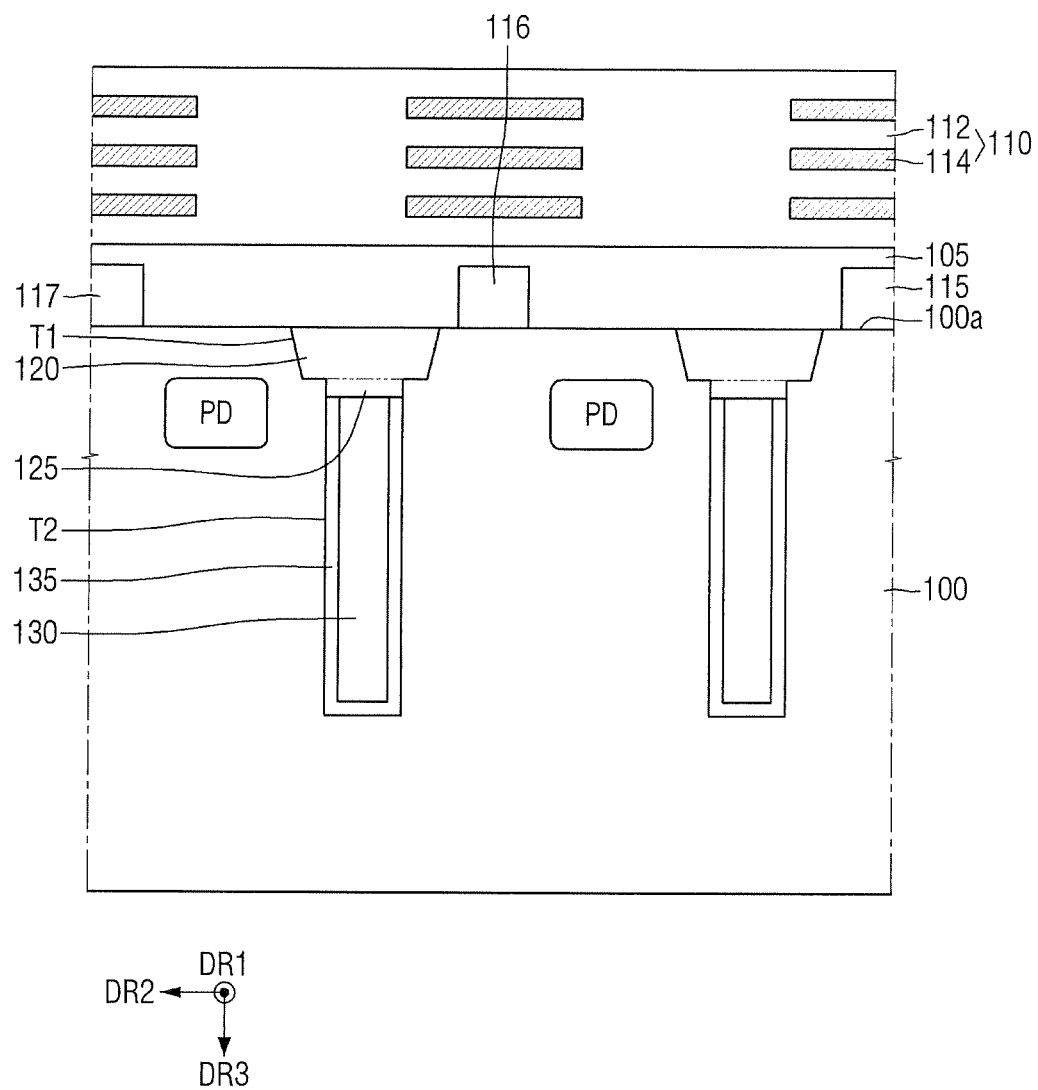

Referring to FIG. 16, the insulating structure 110 including the insulating interlayer 112 and the metal line 114 is formed on the insulating layer 105.

Figure 17:
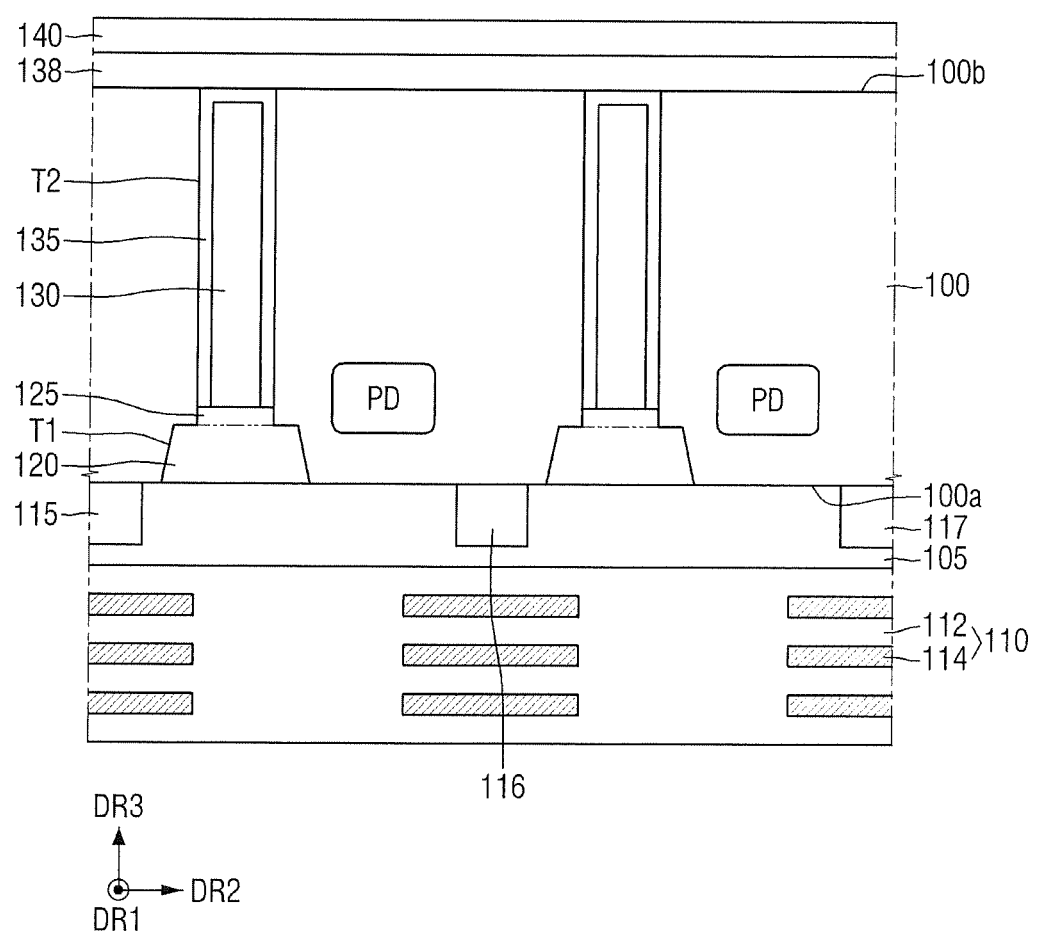

Referring to FIG. 17, a portion of the substrate 100 is removed such that a thickness of the substrate 100 is reduced. For example, after the substrate 100 is inverted such that the second surface 100b of the substrate 100 faces upward, a planarization process may be performed to remove a portion of the substrate 100. By the above planarization process, the first trench passivation layer 135 in the second trench T2 may be exposed.

The passivation layer 138 is formed on the second surface 100b of the substrate 100. The passivation layer 138 may be formed by atomic layer deposition, physical vapor deposition, and/or chemical vapor deposition. The planarization layer 140 is formed on the passivation layer 138.

Next, the color filter 150 (see FIG. 3) and the micro lens 160 (see FIG. 3) are formed on the planarization layer 140. Thus, the image sensor shown in FIG. 3 may be manufactured.

Figure 18:
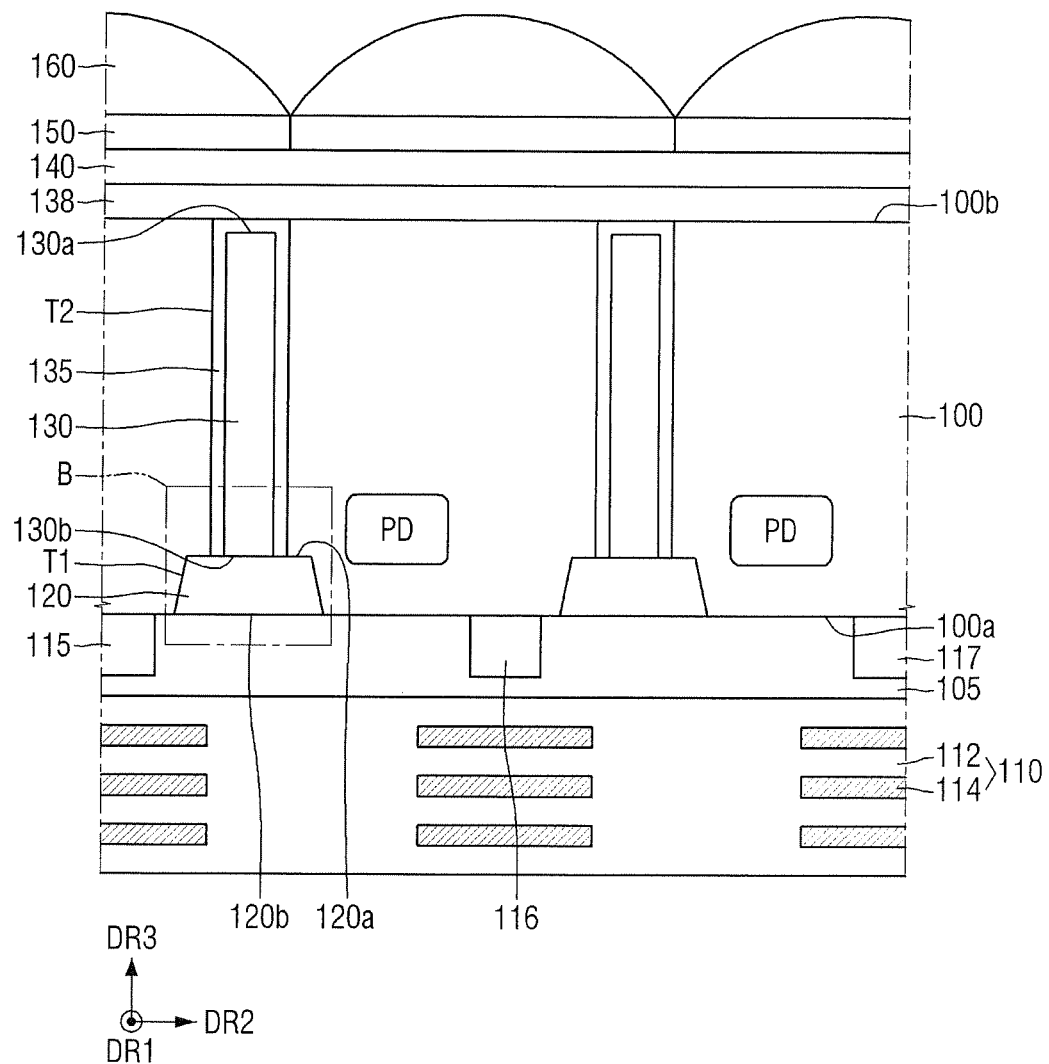
FIG. 18 illustrates an image sensor according to example embodiments.
Figure 19:
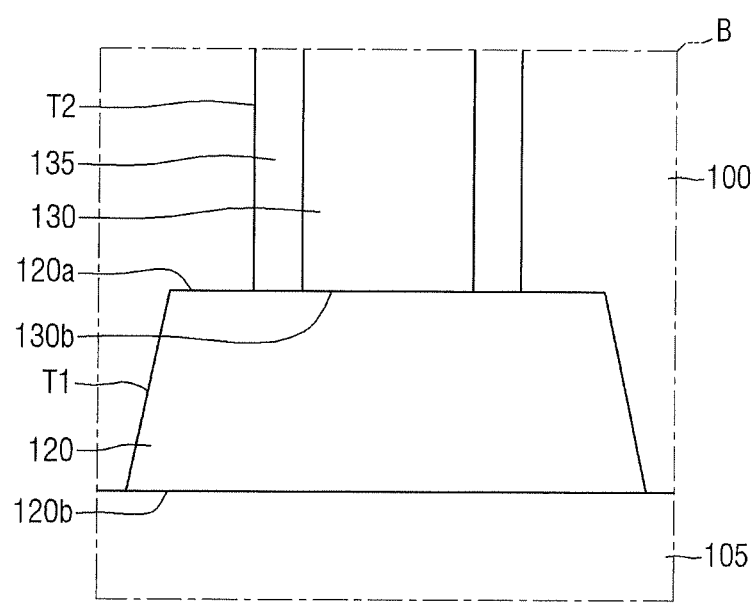
FIG. 19 is an enlarged view of portion B of FIG. 18.

FIG. 18 illustrates an image sensor according to example embodiments. FIG. 19 is an enlarged view of portion B of FIG. 18. Differences between the present example embodiment and the example embodiments described with reference to FIG. 3 will be mainly described below.

Referring to FIGS. 18 and 19, in the image sensor according to example embodiments of the inventive concepts, the upper surface 120a of the first isolation layer 120 contacts the lower surface 130b of the second isolation layer 130. For example, the upper surface 120a of the first isolation layer 120 may be coplanar with the lower surface 130b of the second isolation layer 130.

The first trench passivation layer 135 may extend along the sidewall of the second trench T2 not to expose the sidewall of the second trench T2. The second isolation layer 130 may be disposed on the first trench passivation layer 135 and completely fill the second trench T2. The lower surface of the first trench passivation layer 135 may contact the upper surface 120a of the first isolation layer 120.

Figure 20:
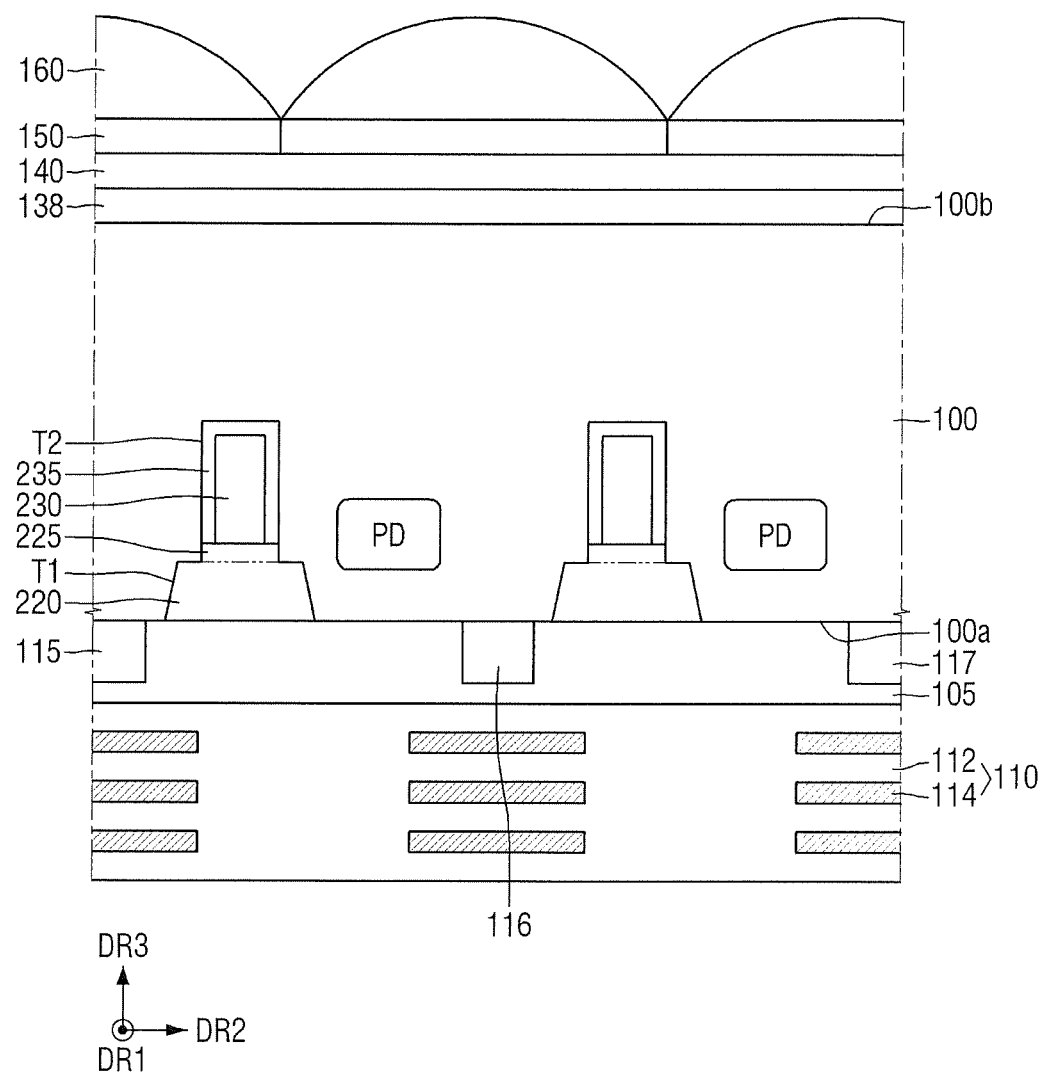
FIG. 20 illustrates an image sensor according to example embodiments.

FIG. 20 illustrates an image sensor according to example embodiments. Differences between the present example embodiment and the example embodiments described with reference to FIG. 3 will be mainly described below.

Referring to FIG. 20, in the image sensor according to example embodiments of the inventive concepts, the second trench T2 is disposed in the substrate 100 while being spaced apart from the second surface 100b of the substrate 100.

A first isolation layer 220 and a third isolation layer 225 may have a structure similar to the first isolation layer 120 and the third isolation layer 125 shown in FIG. 3.

The second trench T2 may not extend to the second surface 100b of the substrate 100 and be disposed in the substrate 100 at a predetermined depth. Thus, a first trench passivation layer 235 extending along an inner surface of the second trench T2 may not contact the passivation layer 138.

A second isolation layer 230 may have a depth smaller than that of the second isolation layer 130 shown in FIG. 3.

Figure 21:
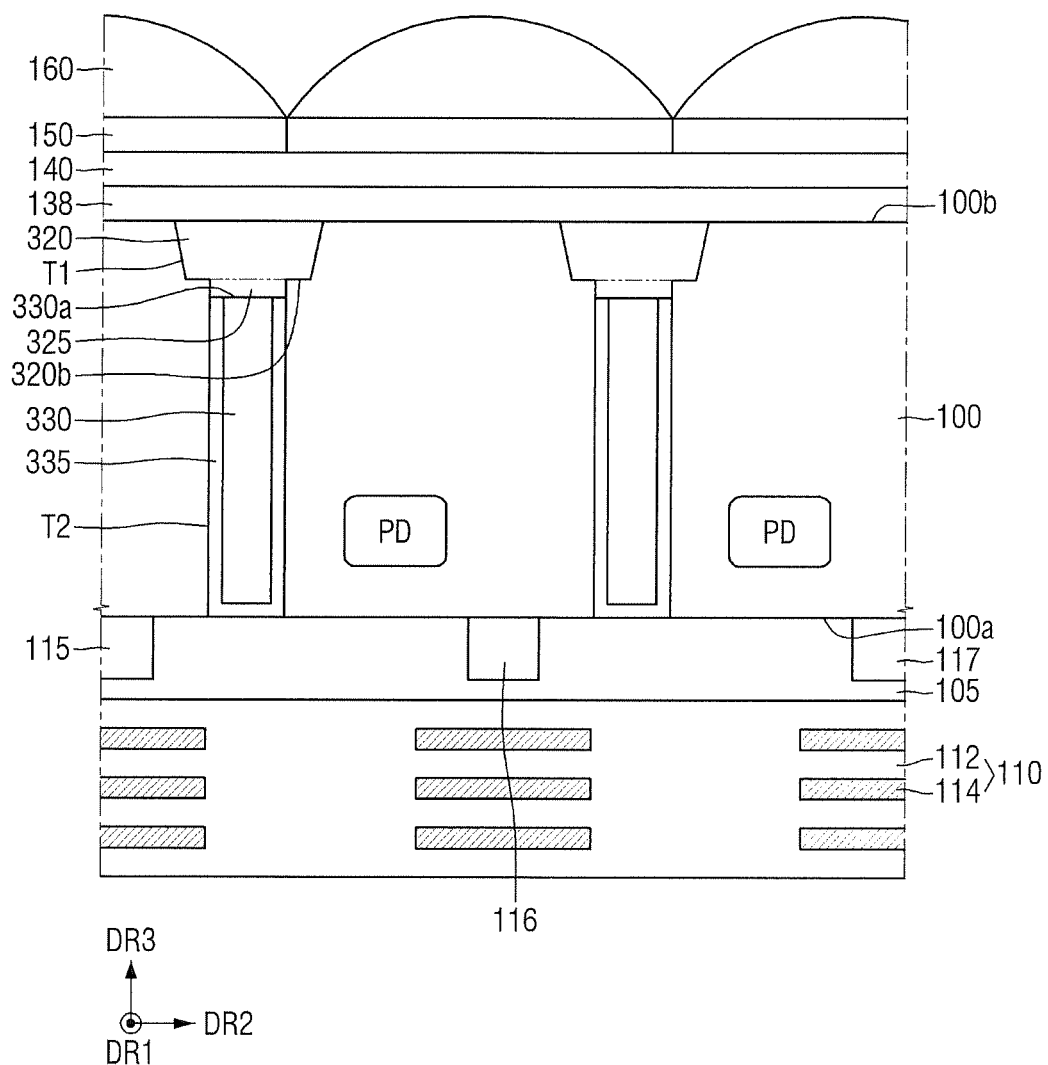
FIG. 21 illustrates an image sensor according to example embodiments.

FIG. 21 illustrates an image sensor according to example embodiments. Differences between the present example embodiment and the example embodiments described with reference to FIG. 3 will be mainly described below.

Referring to FIG. 21, in the image sensor according to example embodiments of the inventive concepts, a first isolation layer 320 is disposed proximate to the second surface 100b of the substrate 100.

The first trench T1 may be disposed in the second surface 100b of the substrate 100. The second trench T2 may extend from a lower surface 320b of the first isolation layer 320 to the first surface 100a of the substrate 100.

An upper surface 330a of a second isolation layer 330 may be closer to the first surface 100a of the substrate 100 than the lower surface 320b of the first isolation layer 320.

A third isolation layer 325 may be disposed between the second isolation layer 330 and the first isolation layer 320 and between a first trench passivation layer 335 enclosing the second isolation layer 330 and the first isolation layer 320.

Figure 22:
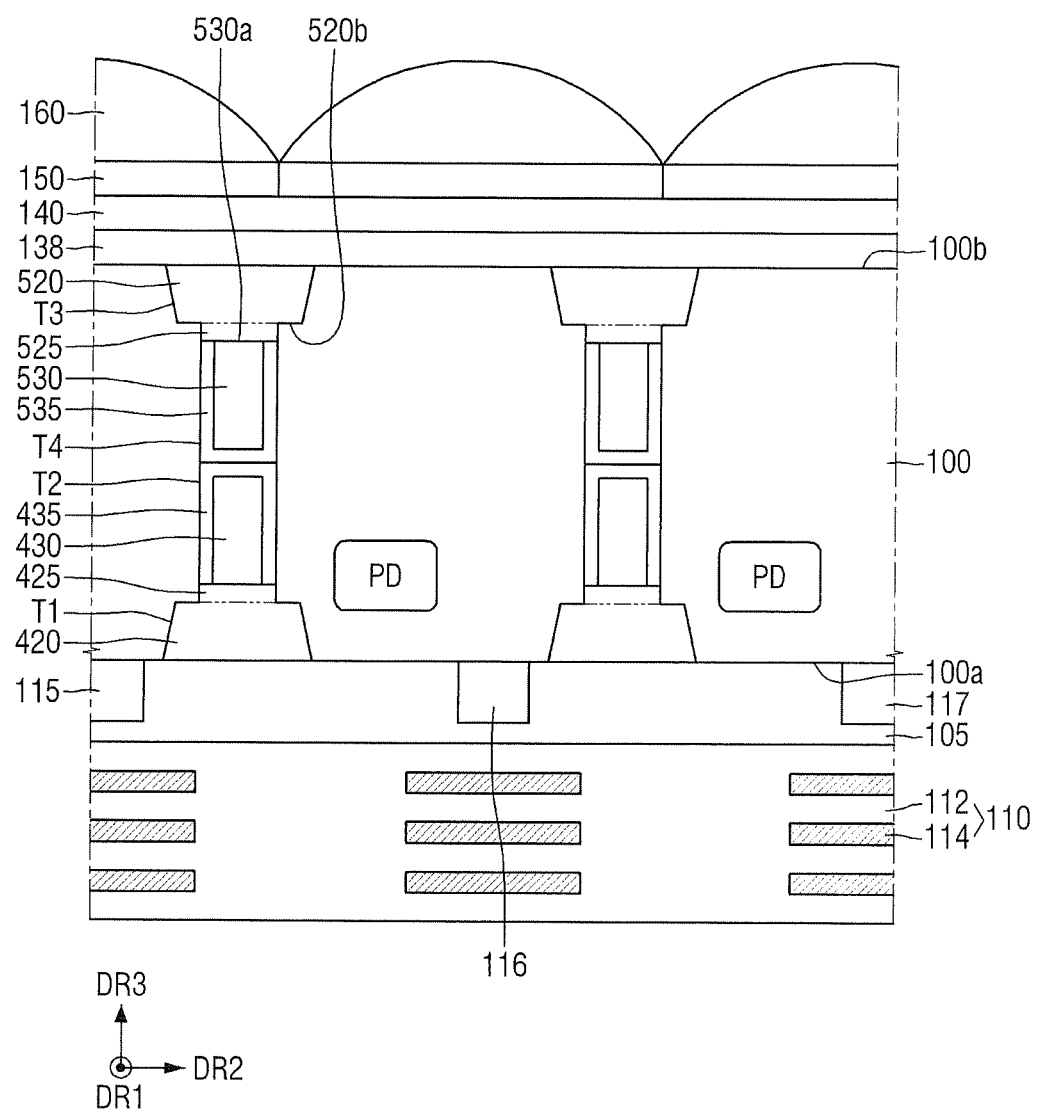
FIG. 22 illustrates an image sensor according to example embodiments.

FIG. 22 illustrates an image sensor according to example embodiments. Differences between the present example embodiment and the example embodiments described with reference to FIG. 3 will be mainly described below.

Referring to FIG. 22, in the image sensor according to example embodiments of the inventive concepts, a fourth isolation layer 530 is disposed on a second isolation layer 430, in the substrate 100. A fifth isolation layer 520 is disposed on the fourth isolation layer 530, in the substrate 100.

A fourth trench T4 may be disposed on the second trench T2, in the substrate 100. A third trench T3 may be disposed on the fourth trench T4, in the substrate 100. The fifth isolation layer 520 which is disposed in the third trench T3 may contact the passivation layer 138.

The first trench T1 may be in a symmetric relation structurally to the third trench T3. The fourth trench T4 may be in a symmetric relation structurally to the second trench T2.

The fifth isolation layer 520 in the third trench T3 may be in a symmetric relation structurally to a first isolation layer 420 in the first trench T1. Respective ones of the fourth isolation layer 530, a sixth isolation layer 525, and a second trench passivation layer 535 which are disposed in the fourth trench T4 may be in a symmetric relation structurally to respective ones of the second isolation layer 430, a third isolation layer 425, and a first trench passivation layer 435 which are disposed in the second trench T2.

The fifth isolation layer 520 may include the same material as that of the first isolation layer 420, for example, silicon oxide, silicon nitride, silicon carbide, silicon oxycarbide, silicon oxynitride, and/or silicon oxycarbonitride. The fourth isolation layer 530 may include the same material as that of the second isolation layer 430, for example, polysilicon.

The first trench passivation layer 435 on an upper surface of the second isolation layer 430 may contact the second trench passivation layer 535 on a lower surface of the fourth isolation layer 530.

A lower surface 520b of the fifth isolation layer 520 may closer than an upper surface 530a of the fourth isolation layer 530 to the second surface 100b of the substrate 100.

Figure 23:
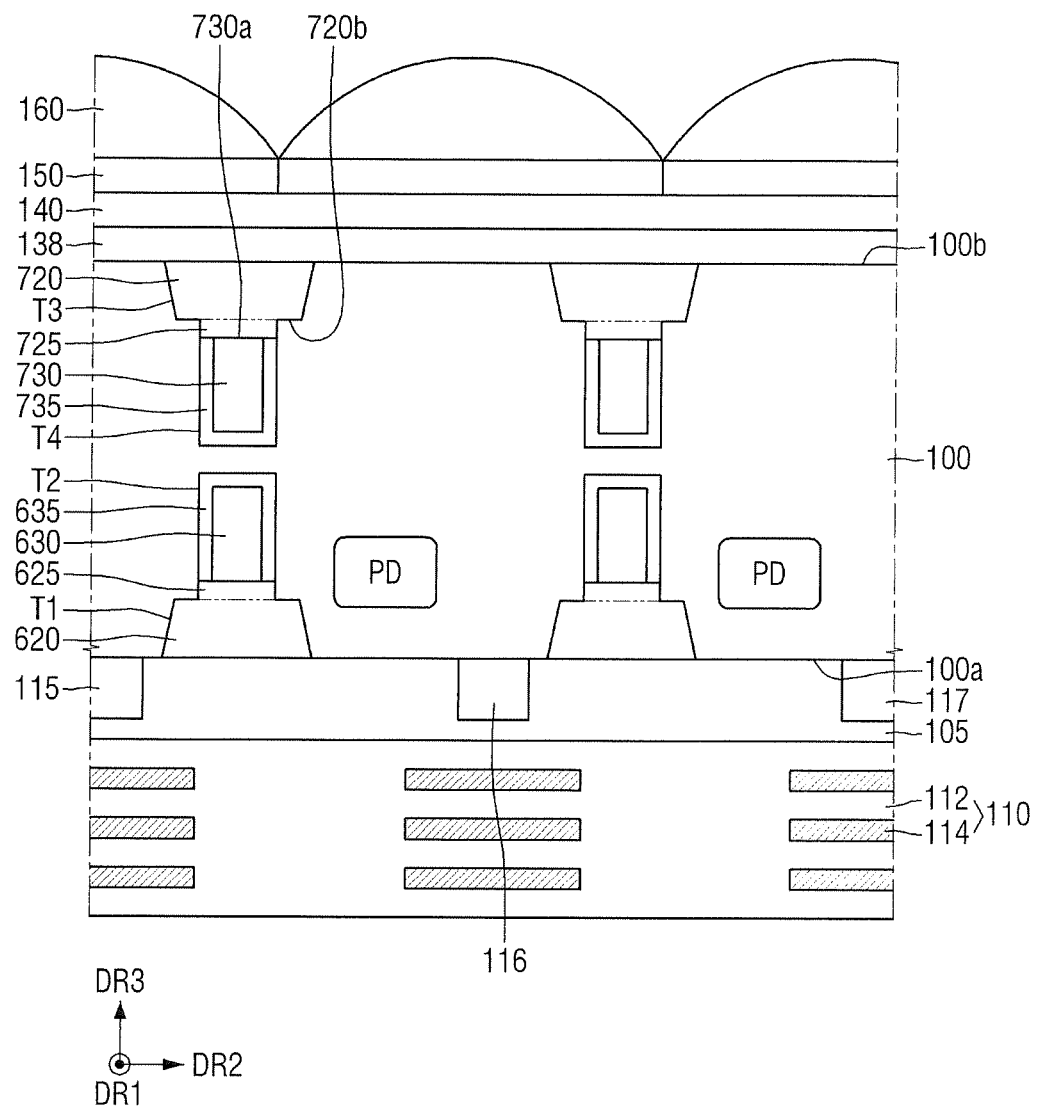
FIG. 23 illustrates an image sensor according to example embodiments.

FIG. 23 illustrates an image sensor according to example embodiments. Differences between the present example embodiment and the example embodiments described with reference to FIG. 3 will be mainly described below.

Referring to FIG. 23, in the image sensor according to example embodiments of the inventive concepts, a fourth isolation layer 730 is disposed on a second isolation layer 630, in the substrate 100. A fifth isolation layer 720 is disposed on the fourth isolation layer 730, in the substrate 100. The second isolation layer 630 and the fourth isolation layer 730 are vertically spaced apart from each other.

A fourth trench T4 may be disposed on the second trench T2, in the substrate 100. A third trench T3 may be disposed on the fourth trench T4, in the substrate 100. The fifth isolation layer 720 which is disposed in the third trench T3 may contact the passivation layer 138.

The first trench T1 may be in a symmetric relation structurally to the third trench T3. The fourth trench T4 may be in a symmetric relation structurally to the second trench T2.

The fifth isolation layer 720 in the third trench T3 may be in a symmetric relation structurally to a first isolation layer 620 in the first trench T1. Respective ones of the fourth isolation layer 730, a sixth isolation layer 725, and a second trench passivation layer 735 which are disposed in the fourth trench T4 may be in a symmetrical relation to respective ones of the second isolation layer 630, a third isolation layer 625, and a first trench passivation layer 635 which are disposed in the second trench T2.

The fifth isolation layer 720 may include the same material as that of the first isolation layer 620, for example, silicon oxide, silicon nitride, silicon carbide, silicon oxycarbide, silicon oxynitride, and/or silicon oxycarbonitride. The fourth isolation layer 730 may include the same material as that of the second isolation layer 630, for example, polysilicon.

The first trench passivation layer 635 on an upper surface of the second isolation layer 630 and the second trench passivation layer 735 on a lower surface of the fourth isolation layer 730 may be vertically spaced apart from each other.

A lower surface 720b of the fifth isolation layer 720 may be closer than an upper surface 730a of the fourth isolation layer 730 to the second surface 100b of the substrate 100.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. An image sensor comprising:
a substrate comprising a first surface and a second surface;
first and second gates on the first surface of the substrate, wherein the first and second gates each extend in a first direction;
a first isolation layer in the substrate between the first and second gates,
wherein the first isolation layer has a first width in a second direction that crosses the first direction; and
a second isolation layer on the first isolation layer, in the substrate,
wherein the second isolation layer has a second width that is less than the first width in the second direction,
wherein the second isolation layer is closer to the second surface of the substrate than the first isolation layer, and
wherein an upper surface of the first isolation layer and a bottom surface of the second isolation layer are spaced apart from each other at a vertical distance therebetween of ⅓ or less of a height of the first isolation layer.

2. The image sensor according to claim 1, further comprising a third isolation layer between the upper surface of the first isolation layer and the bottom surface of the second isolation layer.

3. The image sensor according to claim 2,
wherein the third isolation layer has a third width that is less than the first width in the second direction.

4. The image sensor according to claim 3,
wherein the third width is greater than the second width.

5. The image sensor according to claim 1, further comprising a first trench passivation layer covering a sidewall of the second isolation layer.

6. The image sensor according to claim 1, further comprising:
a fourth isolation layer on the second isolation layer, in the substrate; and
a fifth isolation layer on the fourth isolation layer, in the substrate,
wherein the fifth isolation layer is closer than the fourth isolation layer to the second surface of the substrate.

7. The image sensor according to claim 6, further comprising:
a first trench passivation layer on the second isolation layer; and
a second trench passivation layer under the fourth isolation layer,
wherein the first trench passivation layer contacts the second trench passivation layer.

8. The image sensor according to claim 6,
wherein the second isolation layer and the fourth isolation layer are vertically spaced apart from each other.

9. The image sensor according to claim 6,
wherein the fourth isolation layer includes polysilicon.

10. The image sensor according to claim 1,
wherein the first isolation layer and the second isolation layer include different materials.

11. The image sensor according to claim 10,
wherein the first isolation layer includes silicon oxide, silicon nitride, silicon carbide, silicon oxycarbide, silicon oxynitride, and/or silicon oxycarbonitride, and the second isolation layer includes polysilicon.

12. An image sensor comprising:
a substrate comprising a first surface and a second surface disposed opposite to each other;
first and second gates on the first surface of the substrate, wherein the first and second gates each extend in a first direction;
a first trench in the substrate between the first and second gates,
wherein the first trench has a first width in a second direction that crosses the first direction and has a first depth in a third direction perpendicular to the first and second directions;
a second trench in the substrate, wherein the second trench has a second width that is less than the first width in the second direction, and wherein the second trench vertically overlaps the first trench;

a first isolation layer in the first trench; and a second isolation layer in the second trench, wherein the second isolation layer comprises a different material from that of the first isolation layer, and wherein an upper surface of the first isolation layer and a bottom surface of the second isolation layer are spaced apart from each other at a vertical distance therebetween of ⅓ or less of the first depth of the first trench.

13. The image sensor according to claim 12, wherein the first trench is closer than the second trench to the first surface of the substrate.

14. The image sensor according to claim 12, wherein the first trench is closer to the first surface than the first trench to the second surface of the substrate.

15. The image sensor according to claim 12, wherein the first isolation layer contacts the second isolation layer.

16. The image sensor according to claim 12, further comprising a third isolation layer in the second trench and between the first isolation layer and the second isolation layer.

17. An image sensor comprising:

a substrate comprising a first surface and a second surface disposed opposite to each other;

a photoelectric conversion element in the substrate;

first and second gates spaced apart from one another on the first surface of the substrate;

a first isolation layer in the substrate between the first and second gates;

a second isolation layer in the substrate, wherein the second isolation layer comprises polysilicon, and wherein the second isolation layer vertically overlaps the first isolation layer and is closer to the second surface of the substrate than the first isolation layer; and a micro lens on the second surface of the substrate, wherein an upper surface of the first isolation layer and a bottom surface of the second isolation layer are spaced apart from each other at a vertical distance therebetween of ⅓ or less of a height of the first isolation layer.

18. The image sensor according to claim 17, further comprising a third isolation layer between the first isolation layer and the second isolation layer.

19. The image sensor according to claim 17, further comprising a trench passivation layer between the substrate and the second isolation layer and including an insulating material.

20. The image sensor according to claim 17, further comprising a passivation layer between the second surface of the substrate and the micro lens.

\* \* \* \* \*